(12) United States Patent
Shu et al.

(10) Patent No.: US 9,613,684 B2
(45) Date of Patent: *Apr. 4, 2017

(54) SYSTEMS AND METHODS INVOLVING PROPAGATING READ AND WRITE ADDRESS AND DATA THROUGH MULTI-BANK MEMORY CIRCUITRY

(71) Applicant: GSI TECHNOLOGY, INC., Sunnyvale, CA (US)

(72) Inventors: Lee-Lean Shu, Los Altos, CA (US); Robert Haig, Austin, TX (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/732,619

(22) Filed: Jun. 5, 2015

(65) Prior Publication Data

US 2015/0357027 A1  Dec. 10, 2015

Related U.S. Application Data (60) Provisional application No. 62/008,451, filed on Jun. 5, 2014.

(51) Int. Cl.
*G11C 11/00* (2006.01)
*G11C 7/00* (2006.01)
(Continued)

(52) U.S. Cl.
CPC .............. *G11C 11/413* (2013.01); *G11C 8/12* (2013.01); *G11C 11/418* (2013.01)

(58) Field of Classification Search
USPC ......... 365/154, 156, 189.05, 189.15, 189.16, 365/189.17, 230.03, 230.06, 230.08,
(Continued)

(56) References Cited

U.S. PATENT DOCUMENTS

| 6,381,684 | B1 * | 4/2002 | Hronik ..................... G11C 7/10 365/230.03 |
| 7,565,480 | B2 | 7/2009 | Ware et al. |

(Continued)

OTHER PUBLICATIONS

International Search Report and Written Opinion from PCT/US2015/034557 mailed Sep. 15, 2015, 18 pages.

*Primary Examiner* — Trong Phan
(74) *Attorney, Agent, or Firm* — DLA Piper LLP (US); Nicholas Panno (57) ABSTRACT

Multi-bank SRAM devices, systems, methods of operating multi-bank SRAMs, and/or methods of fabricating multi-bank SRAM systems are disclosed. For example, illustrative multi-bank SRAMs and methods may include or involve features for capturing read and write addresses at a particular frequency, splitting and/or combining them via one or more splitting/combining processes, and bussing them to each SRAM bank, where they may be split and/or combined via one or more splitting/combining processes to read and write to a particular bank. Some implementations herein may also involve features for capturing two beats of write data at a particular frequency, splitting and/or combining them via one or more splitting/combining processes, and bussing them to each SRAM bank, where they may be split and/or combined via one or more splitting/combining processes for writing to a particular bank. Reading and writing to banks may occur at less than or equal to half the frequency of capture.

20 Claims, 7 Drawing Sheets

(51) Int. Cl.

| | | |
|---|---|---|
| *G11C 7/10* | (2006.01) | |
| *G11C 7/22* | (2006.01) | |
| *G11C 8/00* | (2006.01) | |
| *G11C 8/16* | (2006.01) | |
| *G11C 11/413* | (2006.01) | |
| *G11C 8/12* | (2006.01) | |
| *G11C 11/418* | (2006.01) | |

(58) Field of Classification Search
USPC .......................................... 365/233.1, 233.13
See application file for complete search history.

(56) References Cited

U.S. PATENT DOCUMENTS

| | | | |
|---|---|---|---|
| 7,630,230 B2* | 12/2009 | Wong | G11C 5/063 |
| | | | 365/154 |
| 8,982,649 B2* | 3/2015 | Haig | G11C 7/1039 |
| | | | 365/189.17 |
| 2011/0280307 A1 | 11/2011 | MacInnis et al. | |
| 2013/0039131 A1 | 2/2013 | Haig et al. | |
| 2015/0357028 A1* | 12/2015 | Huang | G11C 11/418 |
| | | | 365/154 |

\* cited by examiner

SYSTEMS AND METHODS INVOLVING PROPAGATING READ AND WRITE ADDRESS AND DATA THROUGH MULTI-BANK MEMORY CIRCUITRY

CROSS-REFERENCE TO RELATED APPLICATION(S)

This application claims benefit/priority to U.S. provisional patent application No. 62/008,451, filed Jun. 5, 2014, which is incorporated herein by reference in entirety.

BACKGROUND

Field

Aspects of the present innovations relate generally to multi-bank memory circuitry, and, more specifically, to systems and methods involving capturing and propagating addresses and write data through multi-bank memory circuitry.

Description of Related Information

In Quad-B2 SRAMs, by way of example, the two operations of a read and a write may be initiated per clock cycle, and two beats of data are transferred per operation per clock cycle (i.e. data transfers are DDR—double data rate).

Figure 1:
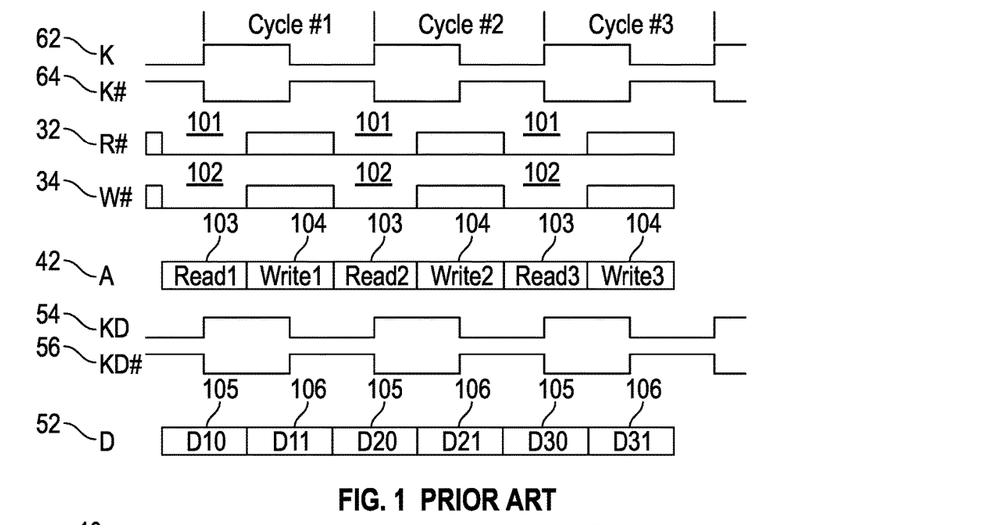
FIG. 1 is a timing diagram of an existing memory circuit.

As depicted in FIG. 1, a read operation is initiated by synchronously asserting the R#32 control pin "low" at the rising edge of the K 62 input clock 101, and by synchronously providing the read address (Read1, Read2, Read3 in each cycle #1, #2, and #3, respectively) on the A address pins at the rising of the K 62 input clock 103.

A write operation is initiated by synchronously asserting the W#34 control pin "low" at the rising edge of the K 62 input clock 102, by synchronously providing the write address (Write1, Write2, Write3 in each cycle #1, #2, and #3, respectively) on the A 42 address pins at the rising of the K#64 input clock a half cycle later 104, by synchronously providing the first beat of write data on the D 52 data pins at the rising edge of the KD 54 input clock (D10/D20/D30 in each cycle #1, #2, and #3, respectively) 105, and by synchronously providing the second beat of write data on the D 52 data pins at the rising edge of the KD#56 input clock a half cycle later (D11/D21/D31 in each cycle #1, #2, and #3, respectively) 106.

Note that the K#64 input clock is the inverse of the K 62 input clock, and the KD#56 input clock is the inverse of the KD#56 input clock. K 62 and K#64 are nominally 180 degrees out of phase, as are KD 54 and KD#56, but both pairs of clocks are allowed to have some amount of phase offset away from 180 degrees. KD/KD#54/56 can either be mesochronous with, or physically the same as, K/K#62/64. When KD/KD#54/56 are mesochronous with K/K#62/64, they are the same frequency and are generated from the same source clock, but are allowed to have some amount of phase offset.

DESCRIPTION OF THE DRAWINGS

The accompanying drawings, which constitute a part of this specification, illustrate various implementations and aspects of the innovations herein and, together with the description, help illustrate the principles of the present inventions. In the drawings.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Some implementations of the present invention herein describe systems and methods for capturing pairs of read and write addresses, and propagating them to each memory bank. The read and write control signals are captured and propagated to each memory bank. Two beats of write data are captured and transferred per write operation, and are propagated to each memory bank. Details on different implementations are provided below.

At each memory bank, the bank address portion of the read and write addresses are used to determine if the associated read and/or write operation(s) are targeted for that particular bank.

At each memory bank, the non-bank address portion of the read and write addresses are used to select the particular location(s) within the bank to be read and/or written, if the associated read and/or write operation(s) are targeted for that particular bank (as determined by the bank address portion of the read and write addresses).

At each memory bank, the appropriate two beats of write data are selected to be stored in the particular location within the bank (as determined by the non-bank address portion of the write addresses), if the associated write operation is targeted for that particular bank (as determined by the bank address portion of the write address).

Figure 2A:
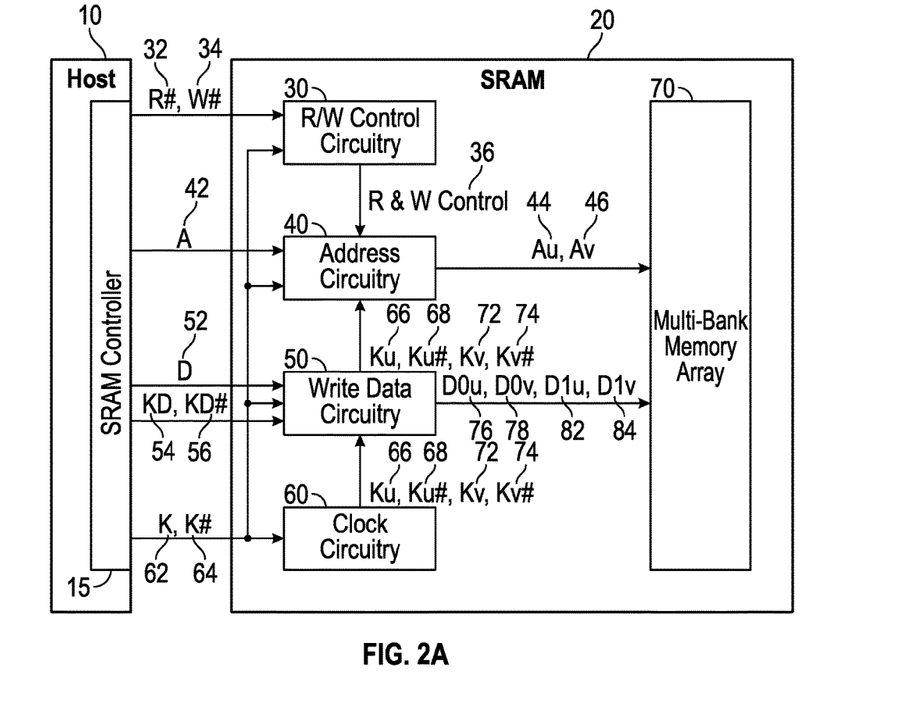
FIG. 2A is a block diagram of an illustrative high-level system, consistent with one or more aspects of the innovations herein.

FIG. 2A is a block diagram of a host 10 and multi-bank memory circuitry 20, consistent with one or more aspects of the innovations herein. The memory circuitry 20 is shown as SRAM in this example, although those of ordinary skill in the art will understand that many other types of memory may be utilized in connection with the various multi-bank memory circuitry set forth herein. The memory circuitry 20 may include a memory array 70 in which data may be written and from which data may be read. The memory circuitry 20 may also include read/write (R/W) control circuitry 30, address circuitry 40, write data circuitry 50, and/or clock circuitry 60.

A host 10 may include a memory controller 15 (e.g., a SRAM controller in this example) configured to communicate with the memory circuitry 20. For example, as explained in greater detail below, memory controller 15 may send first read control R#32 and/or first write control W#34 signals to R/W control circuitry 30, address signal A 42 to address circuitry 40, data signal D 52 to write data circuitry 50, input clock signals KD 54 and/or KD#56 to write data circuitry 50, and/or input clock signals K 62 and/or K#64 to one or more of R/W control circuitry 30, address circuitry 40, write data circuitry 50, and clock circuitry 60.

R/W control circuitry 30, address circuitry 40, write data circuitry 50, and/or clock circuitry 60 may communicate with one another, and address circuitry 40 and/or write data circuitry 50 may communicate with memory array 70. For example, as explained in greater detail below, clock circuitry 60 may supply clock signals Ku 66, Ku#68, Kv 72, and/or Kv#74 to write data circuitry 50 and/or address circuitry 50. Additionally, R/W control circuitry 30 may send read and/or write control signals (R&W Control) 36 to address circuitry 40. Address circuitry 40 may send address location data Au 44 and/or Av 46 to memory array 70 to specify memory addresses to be read out or written. Write data circuitry may send write data D0$u$ 76, D0$v$ 78, D1$u$ 82, and/or D1$v$ 84 to memory array 70.

FIG. 2A shows a high level example of a host 10 and multi-bank memory circuitry 20 system. The following detailed description provides specific examples of processes and/or components of the system that may provide features and/or advantages involving capturing and propagating addresses and write data through multi-bank memory circuitry 20.

For example, a multi-bank, dual-pipe SRAM device may include a memory array operating a memory array frequency and comprising a plurality of SRAM banks, wherein each SRAM bank includes a block of single port SRAM memory cells organized as a matrix of rows and columns, a decoder, a sense amplifier, and memory cell access circuitry. The SRAM device may include a read/write control circuit controlling a read and a write operation in a single clock cycle for the each SRAM bank. The SRAM device may include an address input pipeline circuit comprising address circuitry, the address circuitry operating at an address circuitry frequency at least twice that of the memory array frequency. The SRAM device may include a data input pipeline circuit comprising data circuitry including a data circuit frequency at least twice that of the memory array frequency, wherein the data circuitry receives first and second beats of write data comprising beat one write data and beat two write data. The SRAM device may also include bank access circuitry at the plurality of SRAM banks.

In some embodiments, the address circuitry may receive a read address and a write address and form a read/write address stream from the read address and the write address to buss the read/write address stream to a corresponding SRAM bank. The address circuitry may also split the read/write address into a read address stream and a write address stream and form the read/write address stream from the read address stream and the write address stream to read and write from the corresponding SRAM bank. In some embodiments, the data circuitry may receive the first beat and the second beat of write and form a first write data stream from the first beat and the second beat to buss the first write data stream to a corresponding SRAM bank. The data circuitry may also split the first write data stream into a second write data stream to write the first beat to the corresponding SRAM bank and a third write data stream to write the second beat to the corresponding SRAM bank.

Figure 2B:
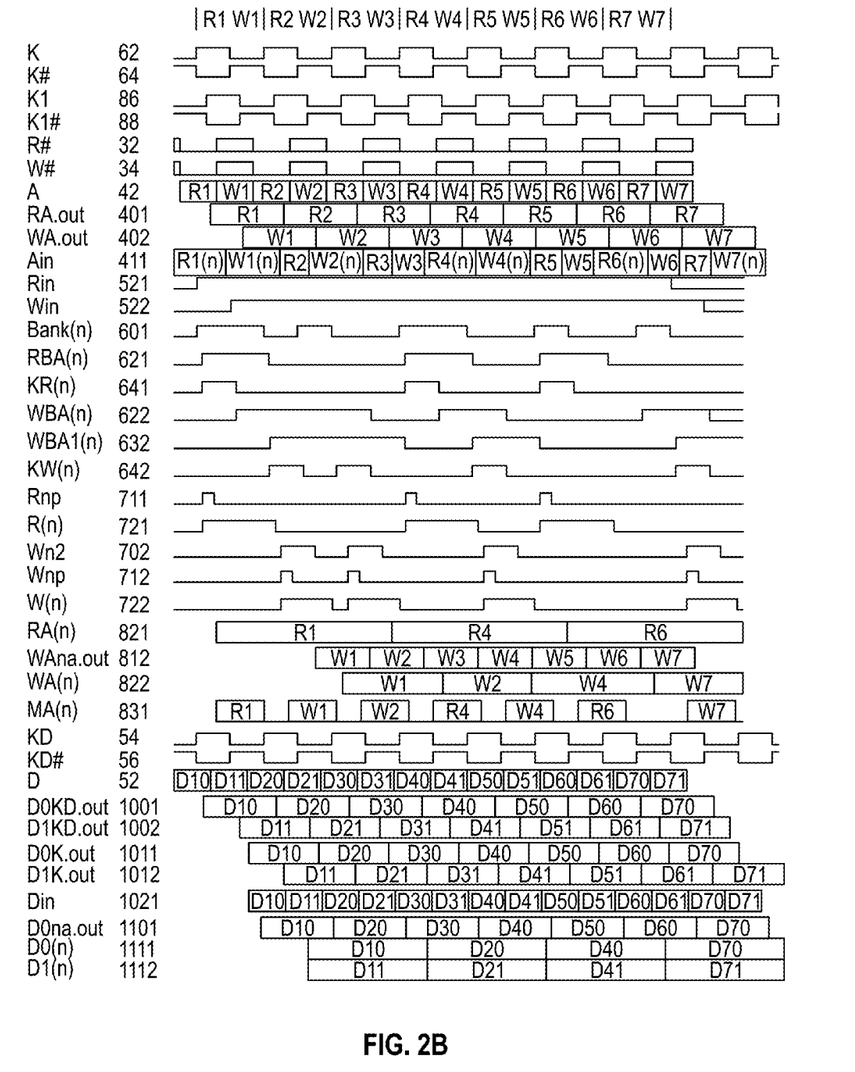
FIG. 2B is a timing diagram depicting illustrative read and write timing aspects, consistent with one or more aspects of the innovations herein.

FIG. 2B is a timing diagram depicting illustrative read and write timing aspects, consistent with one or more aspects of the innovations herein. FIG. 2B depicts the signal timing associated with FIGS. 3 through 12. An "(n)" listed in an Ain address field indicates that bank "n" is the target bank for that particular operation.

Note that when operating at maximum frequency (as illustrated in FIG. 2B), the read operation (e.g., R1, R2, R3, R4, R5, R6, and/or R7), as evident from the width of MA(n) when it contains a read address, may be greater than one cycle in duration, and the write operation (e.g., W1, W2, W3, W4, W5, W6, and/or W7), as evident from the width of MA(n) when it contains a write address, may be less than one cycle in duration.

Note also that when operating at maximum frequency and a read operation is initiated in cycle "n", it must be to a different bank than the one read in cycle "n−1" because the two read operations will overlap some due to them being greater than one cycle in duration, and the one written in cycle "n−1" because the read operation will overlap with the entire write operation. These would be the only bank conflict restrictions in this particular implementation, although it may be possible to impose other bank conflict restrictions if desired.

Note further that when operating at a slower frequency such that a read operation is less than one cycle in duration, a read operation initiated in cycle "n" may be to the same bank as the one read in cycle "n−1", and in that case the only remaining bank conflict restriction may be that the read in cycle "n" cannot be to the same bank as the one written in cycle "n−1", although it may be possible to impose other bank conflict restrictions if desired.

FIG. 2B also illustrates the propagation of data signal 52 half-cycle beats (D10, D11, D20, D21, D30, D31, D40, D41, D50, D51, D60, D61, D70, and/or D71) at various points in the circuit (e.g., 1001-1112) as described in detail below.

Figure 3:
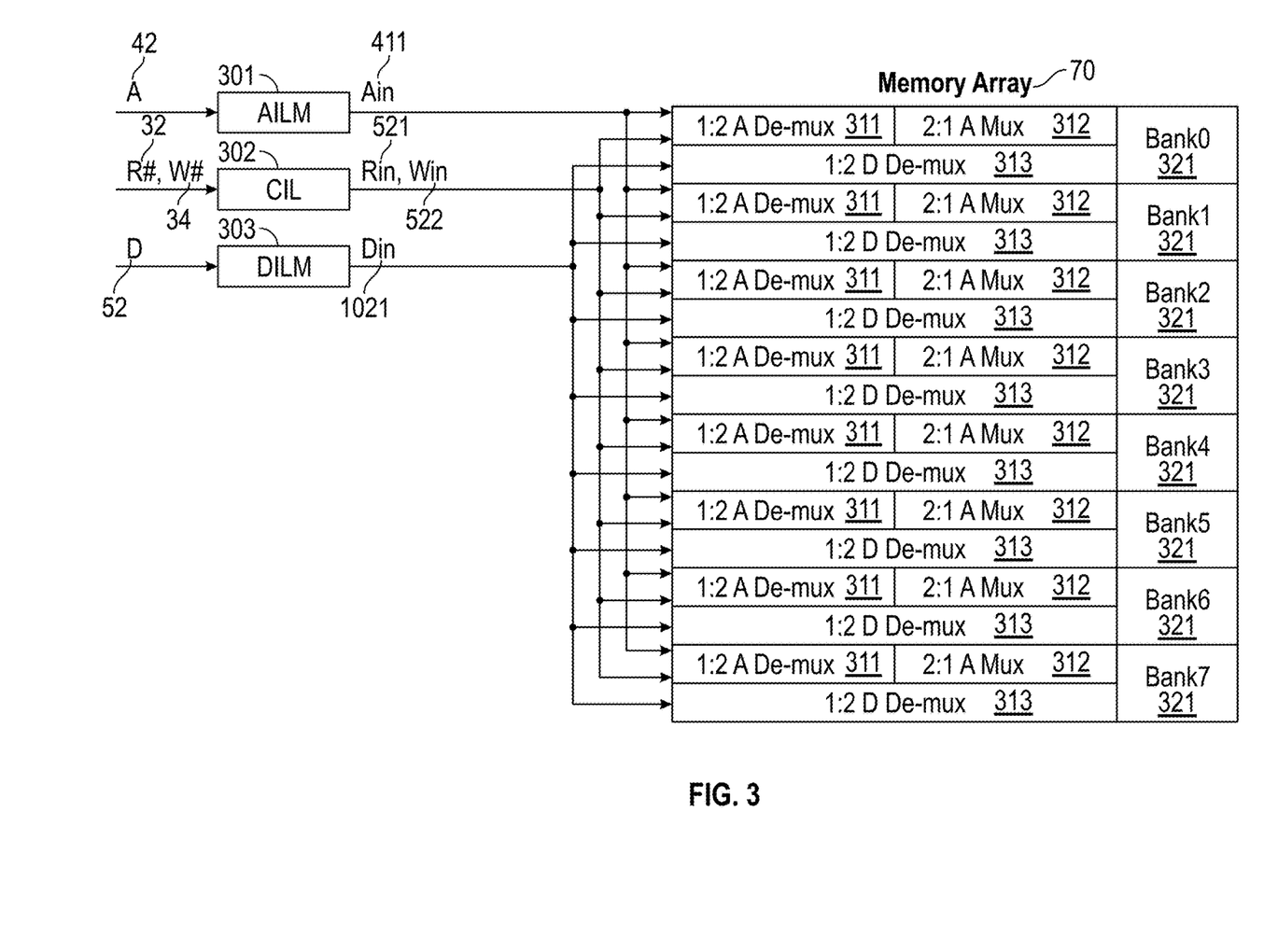
FIG. 3 is a block diagram depicting illustrative a multi-bank memory circuitry, consistent with one or more aspects of the innovations herein.

FIG. 3 is an illustrative block diagram of an eight-bank Quad-B2 SRAM implementation (e.g., of memory array 70), wherein each bank (Bank0-Bank7) 321 is associated with a 1:2 A de-mux 311, a 2:1 A mux 312, and/or a 1:2 D de-mux 313. The Address Input Latch/Mux AILM 301 may latch read and write addresses 42 and time-multiplex them into a single read/write address stream Ain 411 that may be bussed to each memory bank 321. The Control Input Latch CIL 302 may latch read and write control signals R#32, W#42 that may be subsequently bussed as Rin 521 and Win 522 to each memory bank 321. The Data Input Latch/Mux DILM 303 may latch the two beats of write data 52 and time-multiplex them into a single write data stream Din 1021 that is bussed to each memory bank 321.

At each memory bank, the Ain 411 read/write address stream may be de-multiplexed by A De-mux 311 into separate read and write addresses that may be validated by the R#32 and W#42 control signals. A 2:1 mux 312 may be used to select which of those addresses are used to read and/or write the bank 321.

At each memory bank 321, the Din write data stream 1021 may be de-multiplexed by D De-mux 313 into separate beat one and beat two write data that may be used to write the bank 321.

In this manner, the read operation initiated in any particular cycle may be paired with the write operation initiated in the same cycle, and the two operations may be executed sequentially over two cycles, either to the same memory bank or to different banks. In conjunction, the associated read and write addresses may propagate to each memory bank 321 through the AILM 301, the 1:2 A De-mux 311, and the 2:1 A Mux 312, the associated read and write control signals may propagate to each memory bank 321 through the CIL 302, and the associated write data may propagate to each memory bank 321 through the DILM 303, and the 1:2 DDe-mux 313.

Note that because pairs of read and write operations may be executed over two cycles, yet pairs of read and write operations may be initiated every cycle, one or two memory banks may be busy (i.e. in the midst of being accessed) when a new pair of read and write operations is initiated. A user may attempt to avoid "bank conflicts"—i.e. avoid reading banks that are busy due to previous read and write operations.

Note also that with the inventions herein, when a read and write operation initiated to the same bank are executed sequentially over two cycles, each operation may not be necessarily executed within one cycle. Rather, the read operation may be executed in greater than one cycle, and the write may be executed in less than one cycle, provided the combined duration of both operations is no greater than two cycles. This concept is illustrated in FIG. 13 and discussed in detail below.

Address & Control Input

Figure 4:
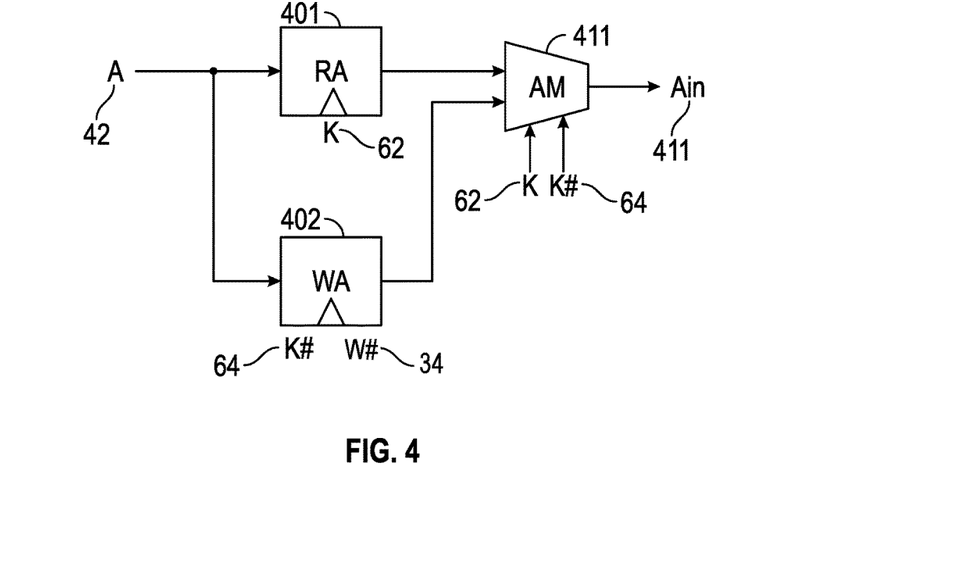
FIG. 4 is a block diagram depicting illustrative address input circuitry, consistent with one or more aspects of the innovations herein.

FIG. 4 is a block diagram depicting illustrative address input circuitry, consistent with one or more aspects of the innovations herein. FIG. 4 illustrates an AILM (e.g., AILM 301 of FIG. 3) including two registers (or latches) 401, 402 and a mux 411. For example, Register RA 401 may use the rising edge of K 62 to capture the read address every cycle, regardless of whether first read control R#32 is captured "low" or "high" at that clock edge; consequently the captured address may be unused if a read operation is not initiated in the cycle. Register WA 402 may use the rising edge of K#64 to capture the write address. One implementation may use the rising edge of K#64 only in cycles in which first write control W#34 is captured "low" at the previous rising edge of K; consequently the captured write address may always be used, and power may be saved in those cycles in which write operations are not initiated.

Mux AM 411 may time-multiplex the captured read and write addresses into a single read/write address stream Ain 411 that may be bussed to each memory bank. K 62 clock "high" may cause the read address 401 to be selected (i.e. muxed into the Ain address stream), and K#64 clock "high" may cause the write address 402 to be selected (i.e. multiplexed into the Ain address stream). Like with the WA 402 register, one implementation may use the rising edge of K#64 only in cycles in which first write control W#34 is captured "low" at the previous rising edge of K; consequently Ain may only change from a read address to a write address if a write operation is initiated, and power may be saved in those cycles in which a write operation is not initiated.

Figure 5:
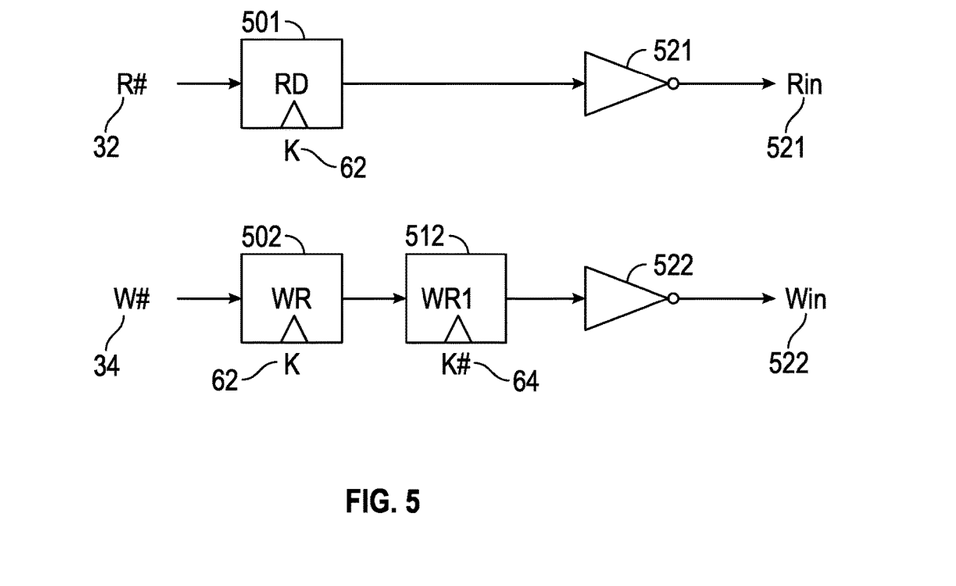
FIG. 5 is a block diagram depicting illustrative control input latch circuitry, consistent with one or more aspects of the innovations herein.

FIG. 5 is a block diagram depicting illustrative control input latch circuitry, consistent with one or more aspects of the innovations herein. As illustrated in FIG. 5, the CIL (e.g., CIL 302 of FIG. 3) may include three registers (or latches) 501, 502, 512 and two inverters 521, 522. Register RD 501 may use the rising edge of K 62 to capture the (active-low) read control signal every cycle, and its output may be inverted (Rin) 521 to create an active-high Rin signal. Register WR 502 may use the rising edge of K 62 to capture the (active-low) write control signal every cycle, register WR1 512 may use the rising edge of K#64 to re-latch the write control signal from WR every cycle, and its output may be inverted (Win) 522 to create an active-high Win signal.

Figure 6:
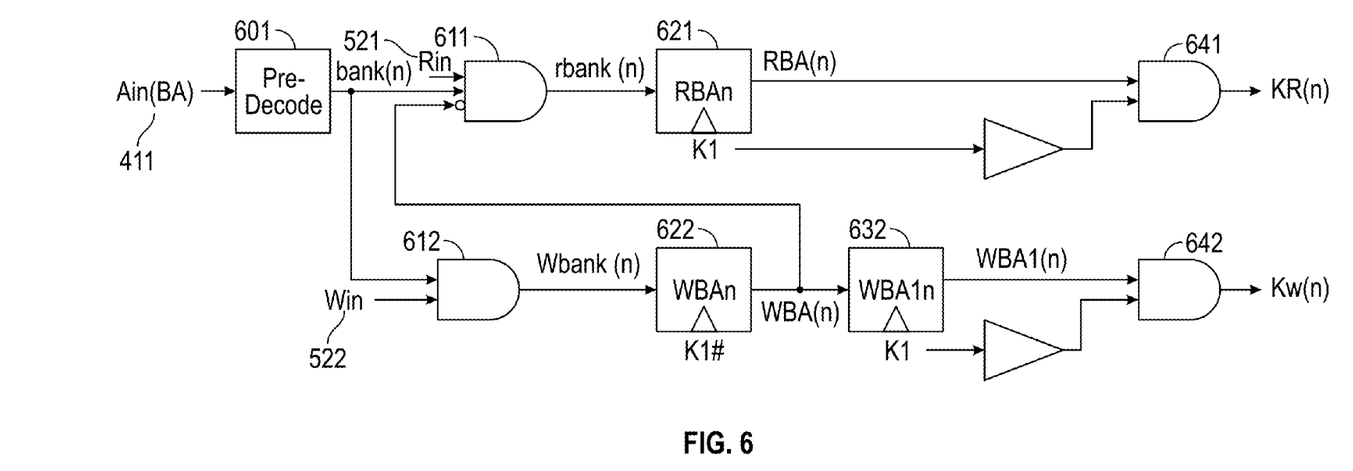
FIG. 6 is a block diagram depicting illustrative de-multiplexer, consistent with one or more aspects of the innovations herein.

FIG. 6 is a block diagram depicting an illustrative de-multiplexer, consistent with one or more aspects of the innovations herein. At each memory bank in FIG. 6 (e.g., memory banks 321 of FIG. 3), the bank addresses in the Ain read/write address stream (Ain(BA) 411) may be decoded by Pre-Decoder 601 to generate a single bit output bank (n), which may be active if the bank addresses indicate that the corresponding read or write operation is targeted for that particular bank.

Four AND gates 611, 612, 641, 642 and three registers (or latches) 621, 622, 632 may be used to de-multiplex the bank (n) signal into separate read bank (n) and write bank (n) signals (representing the 1:2 A De-mux 311 of the bank addresses), and those two bank (n) signals may be used to generate a read bank (n) clock and a write bank (n) clock. Bank (n) may be logically ANDed with Rin 521 and with NOT(WBA(n)) via AND gate 611 to generate rbank(n), to ensure it is generated from a valid read address when it is subsequently latched by RBAn, and to prevent a read to bank (n) from occurring if it collides with a write to bank (n) (initiated in the previous cycle) if the bank conflict restrictions are disregarded, for example. Bank (n) may be logically ANDed with Win 522 via AND gate 612 to generate wbank (n), to ensure it is generated from a valid write address when it is subsequently latched by W BAn, for example.

Register RBAn 621 may use the rising edge of K1, which is a delayed version of K, to capture rbank (n), thereby generating a read bank (n) signal RBA(n) that may be active for one cycle. RBA(n) may be logically ANDed with a delayed version of K1 via AND gate 641, thereby generating a read bank (n) clock KR(n).

Register WBAn 622 may use the rising edge of K1#, which is a delayed version of K#64, to capture wbank (n), thereby generating a first write bank (n) signal WBA(n) that may be active for one cycle.

Register W BA1$n$ 632 may use the rising edge of K1 to re-latch WBA(n), thereby generating a second write bank (n) signal WBA1($n$) that may be active for one cycle. WBA1($n$) may be logically ANDed with a delayed version of K1 via AND gate 642, thereby generating a write bank (n) clock KW(n).

Figure 7:
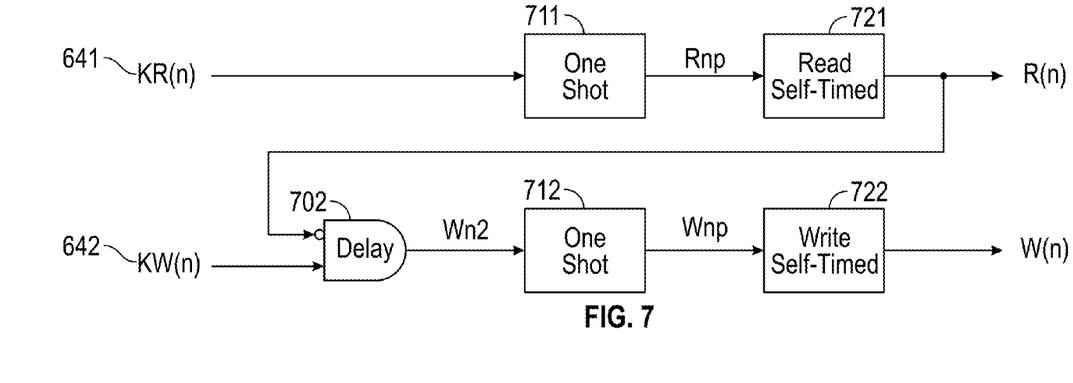
FIG. 7 is a block diagram depicting illustrative read/write circuitry, consistent with one or more aspects of the innovations herein.

FIG. 7 is a block diagram depicting illustrative read/write circuitry, consistent with one or more aspects of the innovations herein. At each memory bank (e.g., memory banks 321 of FIG. 3), and as depicted in FIG. 7, read bank (n) and write bank (n) pulses may be generated from the two clocks generated in FIG. 6.

One Shot logic 711 may use KR(n) to generate a one-shot pulse Rnp. Read Self-Timed logic 721 may use Rnp to generate a read bank (n) pulse R(n) that may be active for less than two cycles but not necessarily less than or equal to one cycle, which ultimately may cause a read operation to bank (n) to occur.

KW (n) may be logically ANDed with NOT(R(n)) via AND gate 702 to ensure W(n) begins after R(n) ends. One Shot logic 712 may use the output of the AND gate, Wn2, to generate a one-shot pulse Wnp. Write Self-Timed logic 722 may use Wnp to generate a write bank (n) pulse W(n) that may be active for less than or equal to one cycle, which ultimately may cause a write operation to bank (n) to occur. The combined duration of R(n) active and W(n) active may be less than or equal to two cycles.

Figure 8:
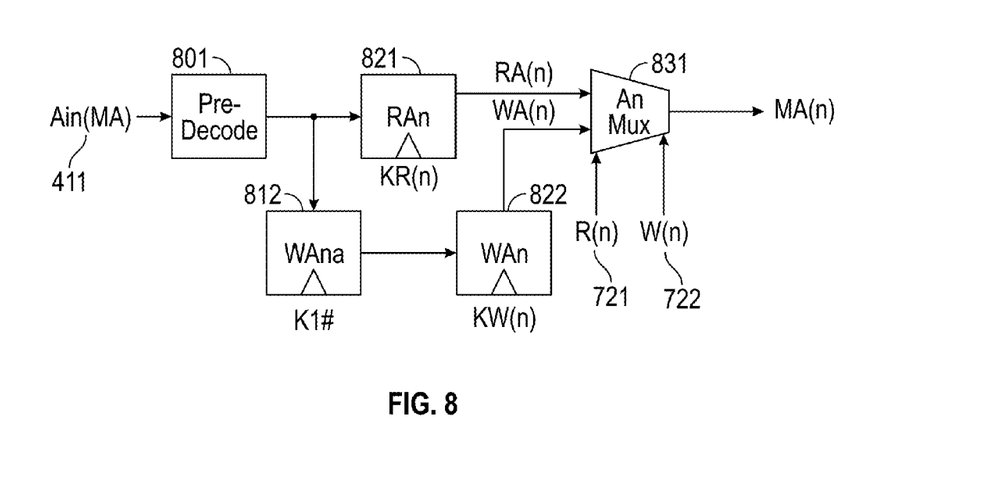
FIG. 8 is a block diagram depicting illustrative address multiplexer, consistent with one or more aspects of the innovations herein.

FIG. 8 is a block diagram depicting illustrative address multiplexer, consistent with one or more aspects of the innovations herein. At each memory bank (e.g., memory banks 321 of FIG. 3), and as depicted in FIG. 8, the non-bank addresses in the Ain read/write address stream (Ain(MA) 411) may be decoded by Pre-Decoder 801, three registers 812, 821, 822 may be used to de-multiplex the decoded non-bank addresses two ways, into separate bank (n) read and write addresses (representing the 1:2 A De-mux 311 of the non-bank addresses), and a 2:1 mux 831 (representing the 2:1 A Mux 312) may be used to select which of those addresses are used to read and/or write the particular bank.

Register RAn 821 may use the rising edge of KR(n) (see FIG. 6) to capture the decoded non-bank addresses, thereby generating bank (n) read addresses RA(n). Register WAna 812 may use the rising edge of K1# to capture the decoded non-bank addresses every cycle, and register WAn 822 may use the rising edge of KW(n) (see FIG. 6) to re-latch the decoded non-bank addresses from WAna, thereby generating bank (n) write addresses WA(n).

An Mux 831 may be used to select which of those bank (n) addresses, RA(n) and/or WA(n), may be used (MA(n)) to read and/or write the particular memory bank.

R(n) may cause RA(n) to be selected, and W(n) may cause WA(n) to be selected.

Figure 9:
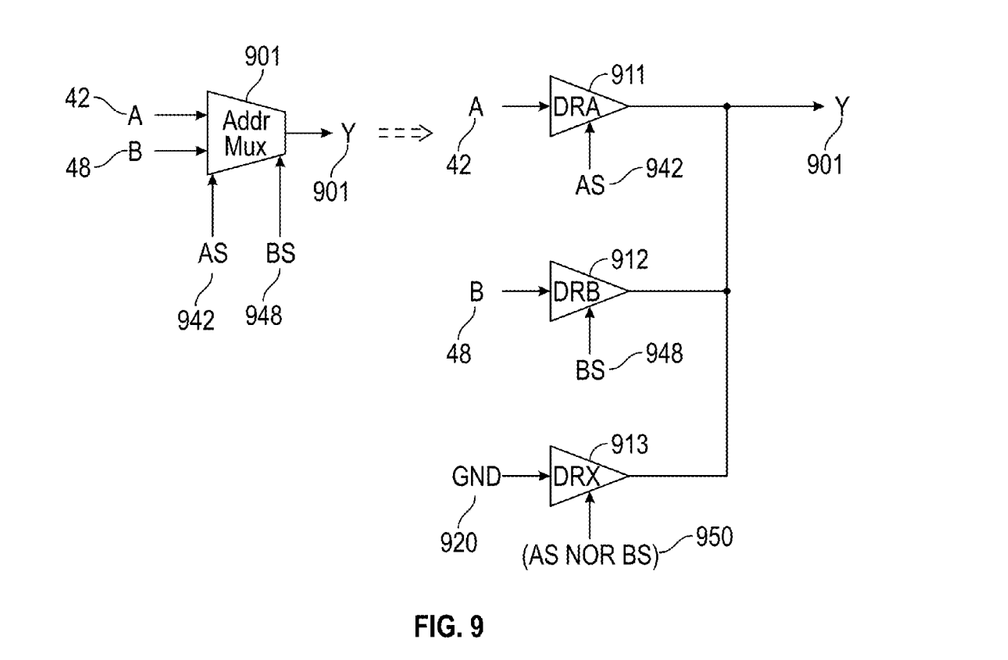
FIG. 9 is a block diagram depicting illustrative address multiplexer, consistent with one or more aspects of the innovations herein.

FIG. 9 is a block diagram depicting illustrative address multiplexer, consistent with one or more aspects of the innovations herein. The address muxes depicted in FIGS. 4 and 8 may be implemented as illustrated in FIG. 9.

A 42 and B 48 may be the two inputs to the mux, and Y 901 may be the output of the mux. AS 942 and BS 948 may be the two "select" signals that may control whether Y is A, Y is B, or Y is 0. Addr Mux 901 is the logical representation of the address mux. In implementation form, it may comprise three drivers DRA 911, DRB 912, and DRX 913. As those of ordinary skill in the art will appreciate, the multiplexer of FIG. 9 is one possible mux implementation, but various well-known or novel muxes may also be used in implementations of the innovations described herein.

The output of DRA may be A when AS is active, and may be tri-stated when AS is inactive. The output of DRB may be B when BS is active, and may be tri-stated when BS is inactive. The output of DRX may be 0 (e.g., by MUXing ground (GND) 920 at DRX 913) when AS and BS are both inactive (AS NOR BS 950), and may be tri-stated otherwise.

Data Input

Figure 10:
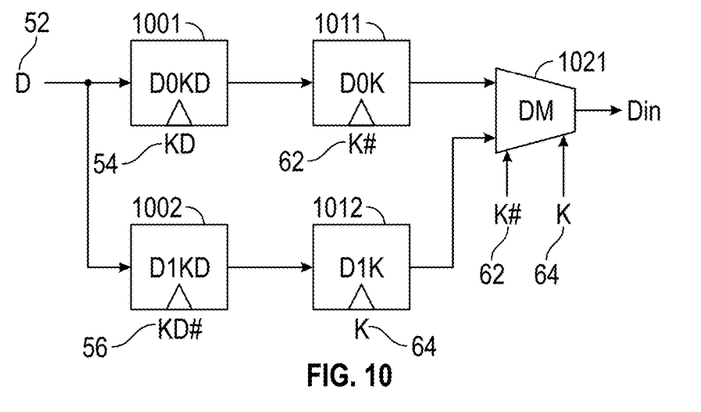
FIG. 10 is a block diagram depicting illustrative data input circuitry, consistent with one or more aspects of the innovations herein.

FIG. 10 is a block diagram depicting illustrative data input circuitry, consistent with one or more aspects of the innovations herein. FIG. 10 illustrates a DILM (e.g., DILM 303 of FIG. 3) including four registers (or latches) 1001, 1002, 1011, 1012 and a mux. 1021 Register D0KD 1001 may use the rising edge of KD 54 to capture the beat one write data every cycle, regardless of whether the first write control W#34 is captured "low" or "high" at the rising edge of K 62 in the same clock; consequently the captured data may be unused if a write operation is not initiated in the cycle. Register D1KD 1002 may use the rising edge of KD#56 to capture the beat two write data every cycle, regardless of whether the first write control W#34 is captured "low" or "high" at the rising edge of K 62 in the same cycle; consequently the captured data may be unused if a write operation is not initiated in the cycle. Register D0K 1011 may use the rising edge of K#64 to re-latch the beat one write data from D0KD, thereby transferring the data from the KD 54 clock domain to the K 62 clock domain. Register D1K 1012 may use the rising edge of K 62 to re-latch the beat two write data from D1KD, thereby transferring the data from the KD 54 clock domain to the K 62 clock domain.

Mux DM 1021 may time-multiplex the captured beat one and beat two write data into a single write data stream Din that may be bussed to each memory bank. K#64 clock "high" may cause the beat one write data to be selected (i.e. muxed into the Din write data stream), and K 62 clock "high" may cause beat two write data to be selected (i.e. muxed into the Din write data stream). Like with Mux AM 411 in FIG. 4, one implementation may use K#64 and K 62 only in cycles in which the first write control W#34 is captured "low" at the previous rising edge of K; consequently Din may only change to a new set of beat one and beat two write data if a write operation is initiated, and power may be saved in those cycles in which a write operation is not initiated.

Note that the implementations of stages one and two in the write data paths may allow for the KD 54 clock edges to lead or trail the corresponding K 62 clock edges by approximately a half cycle.

Figure 11:
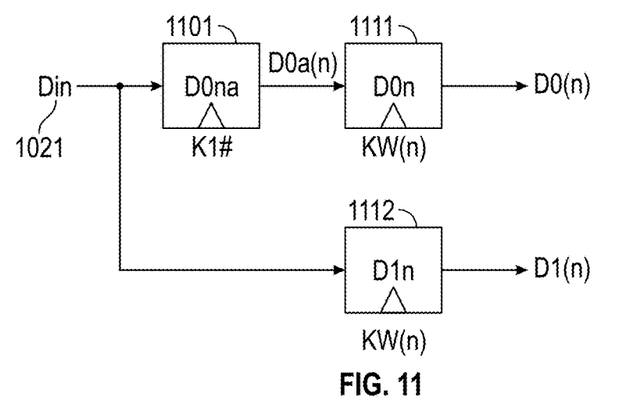
FIG. 11 is a block diagram depicting illustrative data de-multiplexer, consistent with one or more aspects of the innovations herein.

FIG. 11 is a block diagram depicting illustrative data de-multiplexer, consistent with one or more aspects of the innovations herein. At each memory bank (e.g. memory banks 321 of FIG. 3), and as depicted in FIG. 11, three registers 1101, 1111, 1112 may be used to de-multiplex the Din write data stream two ways, into separate bank (n) beat one and beat two write data (representing the 1:2 D De-mux 313) that may be used to write the particular bank.

Register D0*na* 1101 may use the rising edge of K1# to capture the beat one write data every cycle, and register D0*n* 1111 may use the rising edge of KW(n) (see FIG. 6) to re-latch the beat one write data from D0*na*, thereby generating bank (n) beat one write data D0(*n*) that may be used to write the particular memory bank. Register D1*n* 1112 may use the rising edge of KW(n) (see FIG. 6) to capture the beat two write data, thereby generating bank (n) beat two write data D1 (*n*) that may be used to write the particular memory bank.

Figure 12:
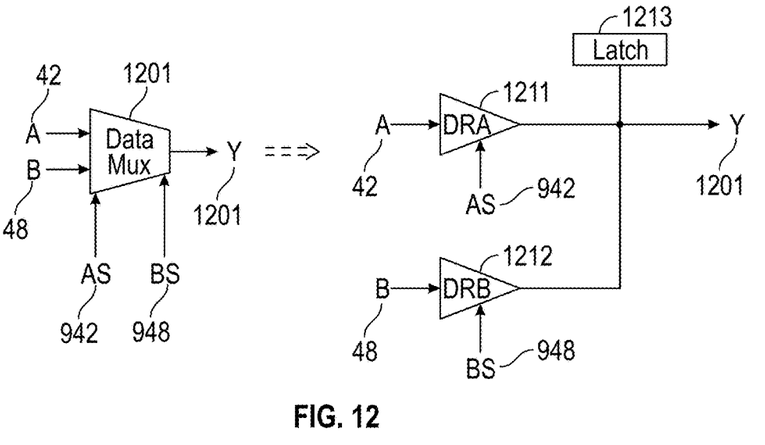
FIG. 12 is a block diagram depicting illustrative data multiplexer, consistent with one or more aspects of the innovations herein.

FIG. 12 is a block diagram depicting illustrative data multiplexer, consistent with one or more aspects of the innovations herein. The data mux depicted in FIG. 10 may be implemented as illustrated in FIG. 12. As those of ordinary skill in the art will appreciate, the multiplexer of FIG. 12 is one possible mux implementation, but various well-known or novel muxes may also be used in implementations of the innovations described herein.

A 42 and B 48 may be two inputs to the mux 1201, and Y may be the output of the mux 1201. AS 942 and BS 948 may be the two select signals that control whether Y is A or Y is B. Data Mux 1201 may be the logical representation of the data mux. In some implementations, Data Mux 1201 may comprise two drivers DRA 1211 and DRB 1212, and a Latch 1213. The output of DRA may be A when AS is active, and may be tri-stated when AS is inactive. The output of DRB may be B when BS is active, and may be tri-stated when BS is inactive. The Latch 1213 may be used to keep output Y at its current state after both AS and BS are inactivated.

Other Features/Aspects

In addition to the above memory innovations and memory architecture, the present inventions also include, inter alia, methods of memory operation, methods of fabricating memory devices consistent with the features and/or functionality herein, products (such as SRAMs or products embodying SRAMs), and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001, 674, 6,117,754, 6,127,706, 6,417,549, 6,894,356, and 7,910, 427 as well as U.S. patent application publication No. US2007/0287239A1, which are incorporated herein by reference.

In some instances, aspects of the innovations herein may be achieved involving logic and/or logic instructions including program modules, executed in association with the circuitry, for example. In general, program modules may include routines, programs, objects, components, data structures, etc. that performs particular tasks or implement particular logic, control, delay or instructions. The inventions may also be practiced in the context of distributed circuit settings where circuitry is connected via communication buses, circuitry or links. In distributed settings, control/instructions may occur from both local and remote computing elements including memory storage devices.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A multi-bank SRAM device comprising:
 a memory array comprising a plurality of SRAM banks, each SRAM bank including a block of single port SRAM memory cells organized as a matrix of rows and columns, a decoder, a sense amplifier, and a memory cell access circuitry, wherein each SRAM bank is capable of operating at a maximum frequency, f(m), and is configured for, and capable of, performing a read operation and a write operation together within a single f(m) clock cycle;
 a read/write control input circuit that receives a read operation and a write operation from an external source within a single external clock cycle of frequency, f(e), and provides those read and write operations to each SRAM bank;
an address input circuit that receives a read address and a write address within the single external clock cycle of frequency, f(e), and provides those read and write addresses to each SRAM bank;
a data input circuit that receives first and second beats of write data within the single external clock cycle of frequency, f(e), and provides the first and second beats of write data to each SRAM bank; and
a bank access circuitry at the plurality of SRAM banks, coupled to the read/write control input circuit, the address input circuit, and the data input circuit, that controls combinations of the read and write operations to the SRAM banks at no greater than the maximum frequency, f(m);
wherein the external clock cycle of frequency, f(e), is at least twice the maximum frequency, f(m), that each SRAM bank is capable of operating at, and the read/write control input circuit operates at the external clock cycle of frequency, f(e), and/or the address input circuit: operates at the external clock cycle of frequency, f(e), and/or the data input circuit: operates at the external clock cycle of frequency, f(e).

2. The device of claim 1, wherein the address input circuit:
receives the read address and the write address and forms a read/write address stream from the read address and the write address to buss the read/write address stream to the corresponding SRAM bank; and
splits the read/write address stream into a read address stream and a write address stream, and forms the read/write address stream from the read address stream and the write address stream to read and write from the corresponding SRAM bank; and
wherein the data input circuit:
receives the first beat and the second beat of write data and forms a first write data stream from the first beat and the second beat to buss the first write data stream to the corresponding SRAM bank; and
splits the first write data stream into a second write data stream to write the first beat to the corresponding SRAM bank and a third write data stream to write the second beat to the corresponding SRAM bank.

3. The device of claim 1, wherein the read operation initiated in the single f(m) clock cycle is paired with the write operation initiated in the single f(m) clock cycle, wherein the read operation and the write operation are executed sequentially over two cycles, either to a same SRAM bank or to a different SRAM bank;
wherein the read operation is executed for less than a duration of two cycles, the write operation is executed for less than or equal to a duration of one cycle, and a combined duration of the read operation and the write operation does not exceed two cycles.

4. The device of claim 1, further comprising:
an address circuitry that uses a first input clock to latch a read address input per clock cycle, wherein the address circuitry uses a second input clock to latch a write address input per clock cycle;
a control circuitry that uses a first input clock to latch a read control signal per clock cycle, wherein the control circuitry that uses the first input clock to latch a write control signal per clock cycle.

5. The device of claim 1, wherein read addresses are restricted to a non-busy SRAM bank due to one or more busy SRAM banks based on previously-initiated read and write operations at a time the read address is inputted and a new read operation is subsequently generated;
wherein write addresses are not restricted insofar as any SRAM bank may be written to at any time regardless of the previously-initiated read and write operations.

6. The device of claim 1, further comprising one or more of:
a first data input clock and a second data input clock, mesochronous with or physically same as the first input clock and the second input clock, respectively, wherein the second data input clock is an inverse of the first data input clock;
a data circuitry using the first data input clock to latch the first beat of write data transferred per clock cycle per write operation; and/or
the data circuitry using the second data input clock to latch a second beat of write data transferred per clock cycle per write operation.

7. The device of claim 1, further comprising:
an address input latch/mux capturing the read and write addresses, and time-multiplexing them into a single address stream that is bussed to each SRAM bank.

8. The device of claim 7 wherein a first portion of the address input latch/mux comprises:
a first address register/latch capturing read addresses on a rising edge of the first input clock every cycle, regardless of a state of a first read control captured on a same rising edge of the first input clock;
a second address register/latch capturing write addresses on a rising edge of the second input clock, in cycles in which a first write control is captured low/active on a preceding rising edge of the first input clock.

9. The device of claim 7, wherein a second portion of the address input latch/mux comprises:
a first 2:1 address mux that time-multiplexes the read and write addresses from the first address register/latch and the second address register/latch together into a single first address stream that is subsequently bussed to each SRAM bank,
wherein a first input clock high selects the read address from the first address register/latch to be multiplexed into the first address stream,
wherein the second input clock high selects the write address from a second address register/latch to be multiplexed into the first address stream.

10. The device of claim 2, further comprising:
a SRAM bank circuitry at each SRAM bank that decodes and de-multiplexes the bank addresses in the read/write address stream two ways into a read bank signal and a write bank signal, and from the read bank signal and the write bank signal generates a read bank signal clock and a write bank signal clock, respectively.

11. The device of claim 2, further comprising:
a SRAM bank circuitry at each SRAM bank that decodes and de-multiplexes the addresses in the read/write address stream two ways into a read address and a write address.

12. The device of claim 1, wherein non-bank addresses in the first address stream are decoded in an address pre-decoder, wherein the SRAM bank circuitry comprising:
registers/latches that de-multiplex the decoded non-bank addresses and generate a read address and a write address.

13. The device of claim 1, further comprising:
an address multiplexer at each SRAM bank that time-multiplexes the read address and the write address into a single SRAM address stream to read and write to the corresponding SRAM bank.

14. The device of claim 2, further comprising:
a SRAM bank circuitry at each SRAM bank that de-multiplexes the two beats of write data in the first write data stream into a separate bank of first beat of write data and a bank of second beat of write data, respectively.

15. The device of claim 1, further comprising:
a first read control input and a first write control input for initiating the read and write operations in a same clock cycle for each and every clock cycle;
a first input clock and a second input clock, wherein the second input clock is the inverse of the first input clock.

16. A method of multi-bank SRAM device operation, the method comprising:
on figuring a memory array comprising a plurality of SRAM banks, each SRAM bank including a block of single port SRAM memory cells organized as a matrix of rows and columns, a decoder, a sense amplifier, and a memory cell access circuitry, wherein each SRAM bank is capable of operating at a maximum frequency, f(m), and is configured for, and capable of, performing a read operation and a write operation together within a single f(m) clock cycle;
receiving via a read/write control input circuit a read operation and a write operation from an external source within a single external clock cycle of frequency, f(e), and providing those read and write operations to each SRAM bank;
receiving via an address input circuit a read address and a write address within a single external clock cycle of frequency, f(e), and providing those read and write addresses to each SRAM bank;
receiving via a data input circuit first and second beats of write data within a single external clock cycle of frequency, f(e), and providing those two beats of write data to each SRAM bank; and
coupling bank access circuitry at the plurality of SRAM banks to the read/write control input circuit, the address input circuit, and the data input circuit, that controls combinations of read and write operations to the SRAM banks at no greater than their maximum operating frequency, f(m);
wherein the external clock frequency, f(e), is at least twice the maximum frequency, f(m), that each SRAM bank is capable of operating at, and operating the read/write control input circuitry at such the external clock frequency, and/or the address input circuit: operates at such the external clock frequency, and/or the data input circuit: operates at such an external clock frequency.

17. The method of claim 16, further comprising:
receiving a read address and a write address and forming a read/write address stream from and to the read address and the write address to buss the read/write address stream to a corresponding SRAM bank via the address input circuit;
splitting the read/write address into a read address stream and a write address stream and forming the read/write address stream from and to the read address stream and the write address stream to read and write from the corresponding SRAM bank via the address input circuit;
receiving the first beat and the second beat of write data and forming a first write data stream from the first beat and the second beat to buss the first write data stream to the corresponding SRAM bank via the data input circuit; and
splitting the first write data stream into a second write data stream to write the first beat to the corresponding SRAM bank and a third write data stream to write the second beat to the corresponding SRAM bank via the data input circuit.

18. The method of claim 16, further comprising:
pairing the read operation initiated in the clock cycle with the write operation initiated in the same clock cycle;
executing the read operation and the write operation sequentially over two cycles, either to a same SRAM bank or to a different SRAM bank;
executing the read operation for less than a duration of two cycles; and
executing the write operation is executed for less than or equal to a duration of one cycle, wherein a combined duration of the read operation and the write operation does not exceed two cycles.

19. The method of claim 16, further comprising:
restricting the read addresses to a non-busy SRAM bank due to one or more busy SRAM banks based on previously-initiated read and write operations at a time the read address is inputted and a new read operation is subsequently generated;
wherein the write addresses are not restricted insofar as any SRAM bank may be written to at any time regardless of the previously-initiated read and write operations.

20. The method of claim 16, further comprising:
capturing the read and write addresses via an address input latch/mux; and
time-multiplexing the read and write addresses into a single address stream that is bussed to each SRAM bank via the address input latch/mux.

* * * * *